United States Patent [19]
Pogge et al.

[11] Patent Number: 6,066,513
[45] Date of Patent: May 23, 2000

[54] PROCESS FOR PRECISE MULTICHIP INTEGRATION AND PRODUCT THEREOF

[75] Inventors: H. Bernhard Pogge, Hopewell Junction; Subramania S. Iyer, Yorktown Heights, both of N.Y.

[73] Assignee: International Business Machines Corporation, Armonk, N.Y.

[21] Appl. No.: 09/165,280

[22] Filed: Oct. 2, 1998

[51] Int. Cl.⁷ .................................................. H01L 21/44
[52] U.S. Cl. .......................... 438/113; 438/401; 438/462; 438/975
[58] Field of Search .................................... 438/113, 114, 438/401, 459, 462, 464, 975

[56] References Cited

U.S. PATENT DOCUMENTS

| | | |
|---|---|---|
| 4,489,364 | 12/1984 | Chance et al. . |
| 4,542,397 | 9/1985 | Biegelsen et al. . |
| 4,670,770 | 6/1987 | Tai . |
| 4,709,468 | 12/1987 | Wilson . |
| 4,783,695 | 11/1988 | Eichelberger et al. . |
| 4,884,122 | 11/1989 | Eichelberger et al. . |
| 4,933,042 | 6/1990 | Eichelberger et al. . |
| 4,949,148 | 8/1990 | Bartelink . |
| 4,954,458 | 9/1990 | Reid ........................................ 438/109 |
| 4,961,821 | 10/1990 | Drake et al. .............................. 438/21 |
| 4,967,146 | 10/1990 | Morgan et al. . |
| 5,019,535 | 5/1991 | Wojnarowski et al. . |
| 5,023,205 | 6/1991 | Reche . |
| 5,034,091 | 7/1991 | Trask et al. . |
| 5,091,330 | 2/1992 | Cambou et al. . |
| 5,168,344 | 12/1992 | Ehlert et al. . |
| 5,207,866 | 5/1993 | Lue et al. . |
| 5,283,205 | 2/1994 | Sakamoto ................................ 438/694 |
| 5,331,203 | 7/1994 | Wojnarowski et al. . |
| 5,353,498 | 10/1994 | Fillion et al. . |
| 5,355,102 | 10/1994 | Kornrumpf et al. . |
| 5,373,627 | 12/1994 | Grebe . |
| 5,432,681 | 7/1995 | Linderman . |

(List continued on next page.)

FOREIGN PATENT DOCUMENTS 0 417 345 A1 3/1991 European Pat. Off. .

OTHER PUBLICATIONS

M. Vangbo et al.; Precise Mask Alignment to the Crystallographic Orientation of Silicon Wafers Using Wet Anistropic Etching; J. Micromech, Microeng. 6; (1996) pp. 279–284.

D. Sander et al.; Fabrication of Metalilc Microstructures by Electroplating Using Deep–Etched Silicon Molds; Journal of Microelectromechanical Systems; vol 4, No. 2; Jun. 1995; pp. 81–86.

J. Talghader et al; Integration of Fluidically Self–Assembled Optoelectronic Devices Using a Silicon–Based Process; IEEE Photonics Technology Letters; vol. 7, No. 11; Nov. 1995; pp. 1321–1323.

H. Linde et al.; Wet Silicon Etching with Aqueous Amine Gallates; J. electrochem. Soc., vol. 139, No. 4, Apr. 1992; pp. 1170–1174.

HDMI—High Density Multichip Interconnect—Reliability Data; Hughes Microelectronic Circuits Division; Marketing Materials; No Date.

R. Wojnarowski et al.; Three Dimensional Hybrid Water Scale Integration Using the GE High Density Interconnect Technology; 1998 International Conference on Wafer Scale Integration; pp. 309–317.

M. Despont, et al.; New Design of Micromachined Capacitive Force Sensor; Journal of Micromechanics and Microengineering; vol. 2, No. 4, Dec. 1993; pp. 239–242.

M. Gdula, et al.; A 36–Chip Multiprocessor Multichip Module made with the General Electric High Density Interconnect Technology; GE Corporate Research and Dvlpmnt Ctr.; 1991 IEEE; pp. 727–730.

*Primary Examiner*—Kevin M. Picardat
*Attorney, Agent, or Firm*—Whitham, Curtis & Whitham; Joseph P. Abate, Esq.

[57] ABSTRACT

Process for making an integrated circuit module and product thereof including a carrier supporting a plurality of precisely aligned semiconductor circuit chips having uniform thicknesses.

18 Claims, 9 Drawing Sheets

U.S. PATENT DOCUMENTS

| | | | |
|---|---|---|---|
| 5,545,291 | 8/1996 | Smith et al. | 438/113 |
| 5,674,785 | 10/1997 | Akram et al. | 438/15 |
| 5,693,181 | 12/1997 | Bernstein | 438/462 |
| 5,731,222 | 3/1998 | Malloy et al. | 438/113 |
| 5,770,884 | 6/1998 | Pogge et al. | 257/506 |
| 5,786,266 | 7/1998 | Borjta et al. | 438/462 |
| 5,814,885 | 9/1998 | Pogge et al. | 257/730 |
| 5,866,443 | 2/1999 | Pogge et al. | 438/170 |
| 5,880,011 | 3/1999 | Zablotny et al. | 438/113 |
| 5,943,587 | 8/1999 | Batterson et al. | 438/401 |
| 5,998,868 | 12/1999 | Pogge et al. | 257/730- |

PROCESS FOR PRECISE MULTICHIP INTEGRATION AND PRODUCT THEREOF

BACKGROUND OF THE INVENTION

1. Field of the Invention

This invention relates to manufacture of multichip integrated circuit device configurations.

2. Description of the Related Art

In the manufacture of integrated circuit devices, system level integration on a single highly wirable substrate is desirable for achieving higher system functionality and performance. Namely, it is desirable to integrate high performance logic, dense memory, RF circuitry, other analog functions, microelectro-mechanical function, and so forth, on a single substrate. However, the technologies used in these individual functions are diverse, and they employ highly varied base technologies, different costs and yields. While it is possible to integrate a few of these components in a given semiconductor technology, such an approach requires compromises in technology with a concomitant degrading of some of the technology attributes, e.g., a reduction of DRAM density in a logic based merged logic and technology, or a reduction of logic performance in a DRAM based merged logic and DRAM technology.

Advances occurring in semiconductor processing have permitted the scale of individual integrated circuit devices to be shrunk to make it possible to incorporate increasing amounts of functionality in a single integrated circuit chip. For example, sixteen 1 MBIT Dynamic Random Access Memory (DRAM) chips of equal size in 1984 required a total chip area of 800 mm$^2$, while a single 16 MBIT design containing the same functionality in 1990 required only 110 mm$^2$. Thus, although the individual chip size has increased by approximately 50%, the net chip area has been reduced by a factor of 8. Accordingly, as integrated circuit chips are required to incorporate more and more functionality, the size of the chips has been steadily increasing.

However, there are practical problems associated with continually increasing the maximum chip size. A first set of problems relates to the physical limits of present day fabrication equipment. For example, state-of-the-art manufacturing lithography equipment commonly used to expose high resolution patterns through masks onto semiconductor substrates effectively limits chip size to the size of the lithography exposure field of the equipment. The size of the direct exposure field of state-of-the-art manufacturing lithography equipment in the mid 1990s is generally on the order of 25 mm in diameter, allowing square chip design exposure of about 324 mm$^2$ (18 mm×18 mm). Most DRAM chip designs in development are rectangular and tend to be 20 mm×10 mm, or larger. A solution to the exposure field/stitching problem is to develop fabrication equipment having a larger exposure field and, therefore, the capability to manufacture larger chips without stitching masks together. However, such a solution would require massive financial investment in research and development.

Another problem relates to the general trend of wafer yields decreasing with increasing chip size. That is, it has been observed that as chip area increases, the effective chip yields reduce nearly linearly. The decrease in yield with increasing chip size can be attributed to the fact that for the same quality of semiconductor, any defect existing in a larger chip results in an overall greater area waste than is the case with smaller chip wafers. As chip size increases, the cost of manufacturing due to yield degradation becomes prohibitive.

Conventional multi-chip modules (MCM's) have avoided the problems associated with producing large chips by combining a plurality of small-sized chips in a larger package. For example, U.S. Pat. No. 4,489,364, assigned to IBM, discloses a ceramic chip carrier for supporting an array of chips by means of solder balls, such as controlled collapsed chip connections (i.e., C4). However, such MCMs tend to be extremely expensive due to their multilayered ceramic features and they require significantly more area than the net overall area of the combined set of chips. As a consequence, the wiring density is not sufficiently high for current requirements in many cases.

Prior to the present invention, there was an unsatisfied need for a multichip integration scheme for combining, in close proximity, a plurality of semiconductor integrated circuit chips.

SUMMARY OF THE INVENTION

It is an object of the present invention to provide a manufacturing process for forming a very dense integrated circuit module with integrated circuit chips and a substrate carrier assembled in a self-aligned manner.

It is another object of the invention to provide an ability to planarize a plurality of integrated circuit chips having non-uniform thicknesses for attachment to a common substrate carrier.

It is yet another object of the present invention to provide a composite integrated circuit module with more precise chip positioning and tighter chip-to-chip placement on a permanent substrate carrier.

These and other objectives are achieved in the present invention by providing a high level, low profile wafer level integrated system on a single substrate carrier using silicon based technology.

The present invention uses a scheme for front reference placement of a diced component chip (DCC) that permits the retention of a planar wiring surface. A mechanical interlock is provided between a three-dimensional topography formed in the surface of a temporary mandrel and a three-dimensional topography formed in the front surface of one or more circuit chips which ensures maintenance of precise alignment of the chip array during a backside planarization operation preformed on the chips that renders their thicknesses uniform before transferring the precisely aligned chip array to a planar surface of a permanent carrier substrate.

In one embodiment, this mechanical interlock of the temporary mandrel and circuit chips is accomplished by crystallographically anisotropic orientational etching of projection and recess surface profiles, respectively, in similar semiconductor bulk materials used in the mandrel and chip integrated circuit materials. The juxtaposed sloping angled faces of the chip recess and the mandrel projection permit insertion of mandrel projection into the chip recess until the opposing major flats of the chip and mandrel come into intimate contact with each other.

In one embodiment, alignment of each chip on the mandrel preferably involves a match-up between two or four pairs of juxtaposed sloping faces, i.e., when the mandrel projection is inserted within a trench or a four-sided well, respectively, provided in the front face of the circuit chip, preferably at its kerf area. This invention permits very dense packing of a plurality of variegated planarized circuit chips on a common carrier substrate.

High performance DRAM and logic components are tested and integrated by the inventive method. The present invention offers the advantage that it can make use of commercially available substrates and wafer bonding technology and silicon back end (BEOL) technology.

In the chip module configurations made by the present invention, the wiring loads are significantly lower than packaging loads even though the wiring loads are greater than conventional silicon wiring loads.

The inventive process permits erector-set type chip building opportunities. For instance, the invention provides for higher yielding smaller chips to be placed on a carrier substrate to permit generation of effectively larger composite chips with higher yields. Also, different chips can be optimized in standard (e.g., DRAM, SRAM, Logic, and so forth) process lines before their marriage with other chips from other process lines, on a common carrier substrate, as opposed to attempting to generate one large chip containing all elements of the final chip. Using such smaller chips as "chip sectors" in this way, the chip sectors can be separately pre-tested for quality and functionality before final placement on a common substrate, thereby optimizing final chip yields. The present invention also allows for a mix and match approach to chip placement with each other on a carrier substrate to realize large chip hybrids (e.g., GaAs with SOI, DRAM with Logic, and so forth).

BRIEF DESCRIPTION OF THE DRAWINGS

The foregoing and other objects, aspects and advantages will be better understood from the following detailed description with references to the drawings, in which.

DETAILED DESCRIPTION OF THE PREFERRED EMBODIMENTS OF THE INVENTION

Figure 1A:
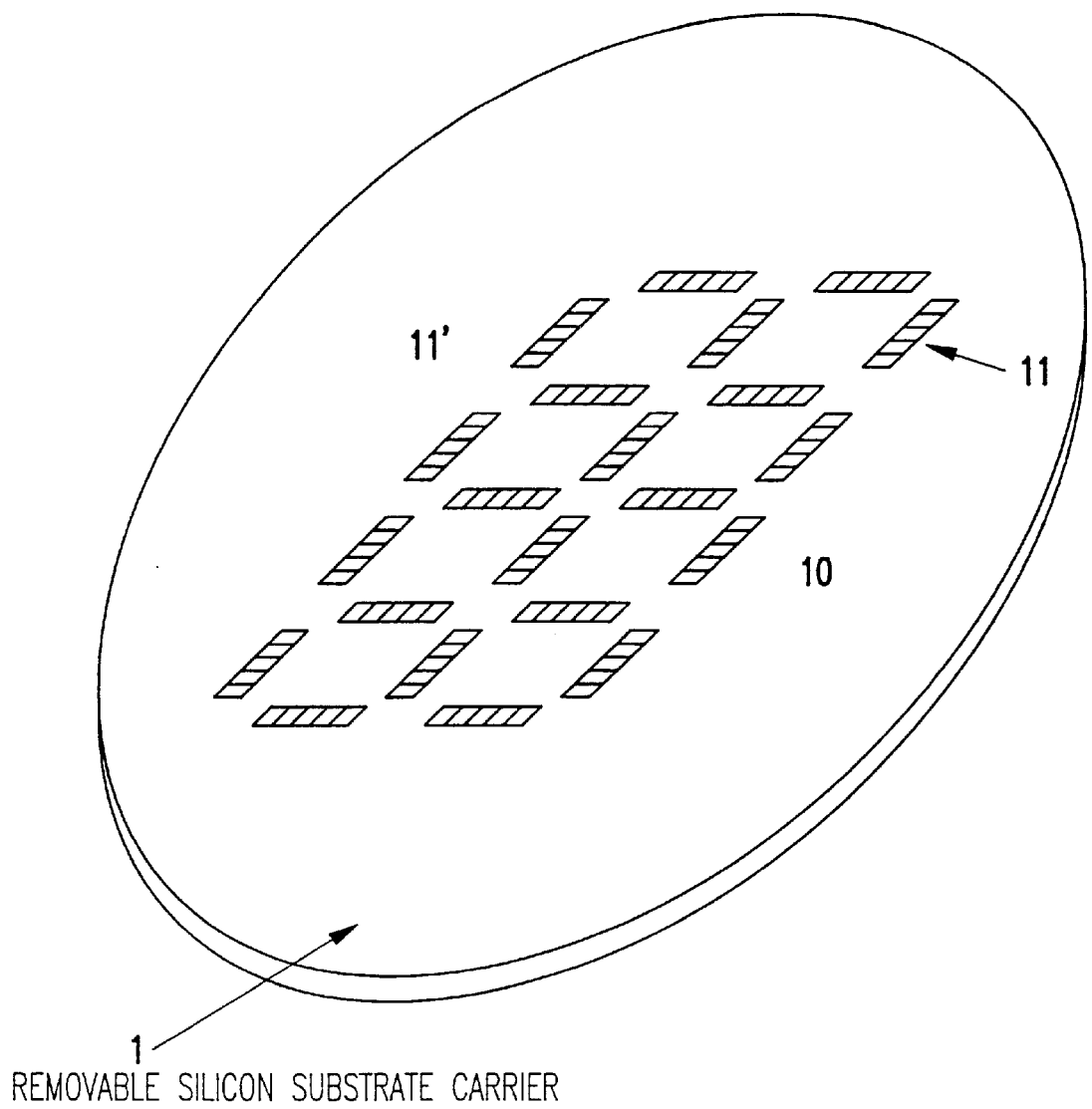
FIG. 1A is an elevational view depicting locations of masked areas to be used in the formation of positioning guidance keys to permit and maintain aligned association of integrated circuit chips with a temporary mandrel during processing according to the process of the invention.

With reference to FIG. 1A, the process of the invention begins by providing a removable mandrel 1. The removable mandrel 1 is used as a temporary chip support in the inventive process scheme. The mandrel 1 is a semiconductor substrate, e.g., a silicon wafer, with at least the major face thereof to be processed according to this invention polished and thermally oxidized according to conventional practices. The thickness tolerance is not critical, and the overall thickness may be as thin as may be reliably processed in the manner described herein. The crystallographic orientation is preferably (100). The mandrel 1 is lightly doped (e.g., 1–10 ohm-cm) with an n-type or p-type dopant. The mandrel is lightly doped with such impurities so that it can be selectively etched away when it is time in the process to selectively etch-remove the mandrel from integrated circuit chips after they have been positioned and appropriately processed thereon in a manner described herein.

Alignment marks (not shown) for aligning a subsequent etch mask to be formed on the mandrel surface are provided by printing pattern marks onto a major face 10 of the mandrel 1 at otherwise non-used regions. The alignment marks are used to align the etch mask next formed on the mandrel surface 10, and the alignment marks are used to ensure that the mask is aligned with the [110] direction. The alignment pattern marks can be made by conventional methods, such as by forming alignment forks according to the techniques described by M. Vangho and Y. Baecklund, *J. Micromech. Microeng.*, vol. 6, pp. 279–284 (1996), which permit a rapid and precise determination of the crystallographic orientation in silicon wafers and which can be used to align subsequent masks. The alignment forks permit alignment accuracies of ±0.5 degrees to be achieved. Alignment pattern marks are also printed onto an opposing major face of each chip wafer to be positioned upon the mandrel 1.

Then, the oxidized surface of the mandrel 1 is patterned to leave discrete rectangular or elongated box structures 11 of silicon oxide at the desired locations of the mandrel silicon surface 10. For example, photolithography is used to leave silicon dioxide masking areas 11 on the silicon surface 10 corresponding to the locations desired for the generation of mesa structure 2 (see FIG. 1B).

Figure 1B:
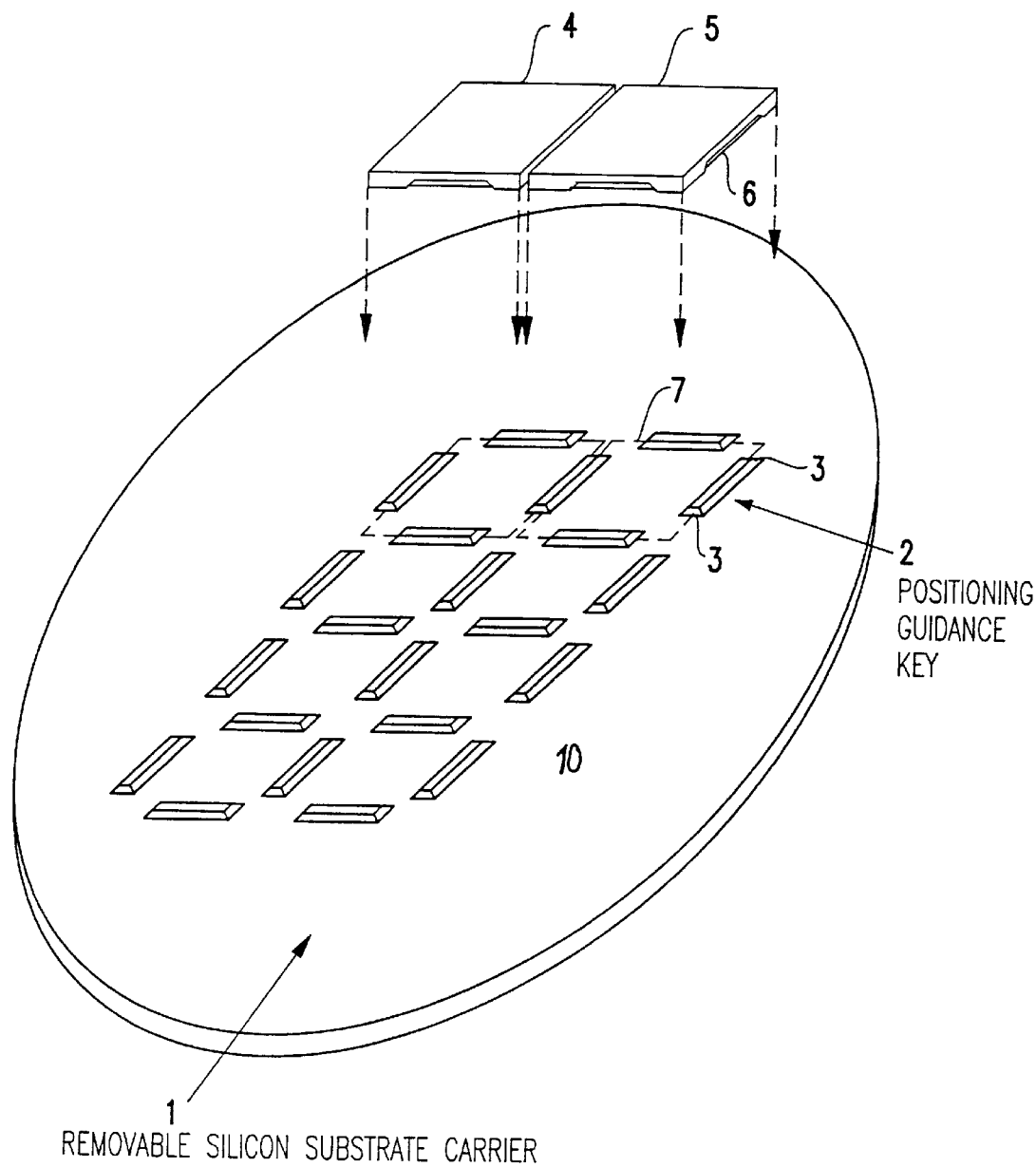
FIG. 1B is an elevational view depicting the manner of aligned association of integrated circuit chips with the temporary mandrel using their respective mesa guide keys and cavities made according to the process of the invention.

Standard pattern etching is then performed which results in upraised mesa structures 2, such as shown in FIG. 1B, being formed in the surface 10 of the mandrel 1 after the surrounding exposed silicon is anisotropically etched away from the rest of the mandrel surface 10. That is, crystallographically anisotropic etching is performed on the exposed unmasked surface region 11' using masking pattern layer 11 as a mask resulting in removal of surface matter from mandrel 1 at rates which differ depending on crystallographic direction. The preferential etching is applied to the bulk portions of the mandrel 1. For this etching step, the etchant preferably can be KOH, EPW (ethylenediamine/pyrocatechol/water), or a modified EPW such as (ethylenediamine/pyrocatechol/quinoxaline/water). Also, other useful etchants include hydrazine, quaternary ammonium hydroxides, and ethylenediamine solutions, such as disclosed in the *J. Electrochem. Soc.* (JECS), Vol. 139, No. Apr. 4, 1992, pages 1170–1174, which teachings are incorporated herein by reference.

As indicated in FIG. 1B, the use of the anisotropic etchant results in (111) oriented sidewalls 3 on the mesas structures 2 formed in the surface 10 of the mandrel 1, as shown in FIG. 1B. The mesa structures 2 are located as an array 7 in such a way on the mandrel 1 so that prefabricated integrated circuit chips 4, 5 can be placed closely adjacent to each other on the mandrel 1. Preferably four mesas 2 will be positioned on the mandrel 1 to interlock with four cavities formed in kerf areas at four sides of each chip (4 or 5). For example, array 7 includes a group of four separate, yet adjacent mesa separate structures 2. It will be appreciated that the array of mesa structures 2 shown in FIG. 1B is representative and not meant to be limiting. Other array configurations of the mesa structures 2 also could be used as long as each array is sufficient to prevent lateral displacements of the corresponding integrated circuit chips 4,5 when positioned on the mandrel 1 during processing. Also, the number of IC chips 4,5 shown in FIG. 1B is also chosen arbitrarily merely to facilitate the illustration.

To form cavities 6 in chips 4, 5 to receive the mandrel alignment mesas 2, and all other IC chips desired to be integrated together and planarized while positioned on the alignment mesas 2 of the mandrel 1, separate processing takes place on the semiconductor wafer or wafers bearing prefabricated IC chips 4, 5, i.e., active areas have been fabricated in the surface of a semiconductor substrate die, but the chips 4, 5 have not yet been diced (separated) out.

Although the following description illustrates the sourcing of the IC chips 4 and 5 from the same original substrate, it will be understood that the chips 4 and 5 in FIG. 1B. could be derived from different substrates.

Figure 2A:
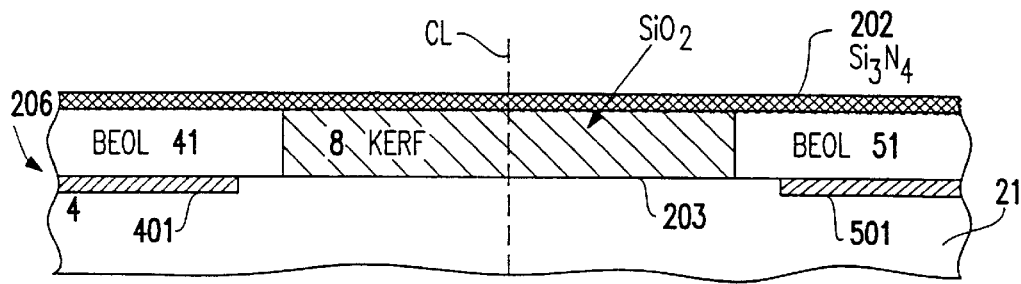
FIGS. 2A–2D shows a process scheme for forming a recess in the chip substrate at the kerf areas where dicing can be performed to provide individual chips with alignment cavities.

The cavity formation in the IC chips is now discussed in more detail with reference to the process scheme shown in FIGS. 2A–2D. As shown in FIG. 2A, the IC chips 4 and 5 initially form part of a larger common substrate wafer 21 constituting chip workpiece 206. Wafer 21 is a semiconductor wafer, such as silicon. Kerf area 8, e.g., a silicon dioxide or other insulator material, forms a non-active area between chips 4 and 5. The back-end-of-line (BEOL) processing metallization 41, 51 has already been performed on the active areas 401, 501 formed in wafer substrate 21 of the chips 4, 5, respectively. The active areas 401, 501 provided will depend on the type of integrated circuit devices desired, for example, bipolar, CMOS, biCMOS, optoelectronics, and so forth. After such devices are formed in the active areas, metallization is provided by conventional metallization techniques to form connections between devices within the same active area. Preferably, additional metal layers (not shown), sufficient for enabling the testing of the finished integrated circuit chip, are also deposited at this step. Such testing preferably provides the ability to screen out defective integrated circuit chips after testing and prior to incorporating them into a larger package, thereby enhancing overall yield of the ultimate assembly. After local metallization and testing, the BEOL metallization 41, 51 for the active areas 401, 501 of the chips 4, 5, respectively, can optionally be coated with a temporary protective layer (not shown) to shield the active areas 401, 501 during further processing. The protective layer could comprise one of many polymers (for example, polyimide or other insulators), which are readily applied, are surface conformal, have adequate thickness (approximately 1–5 $\mu$m), and can withstand subsequent planarization processing. After any such optional protective layer is placed on the metallization, the surfaces of the chip substrate material 21 is ready for processing according to this invention as described below.

Figure 2B:
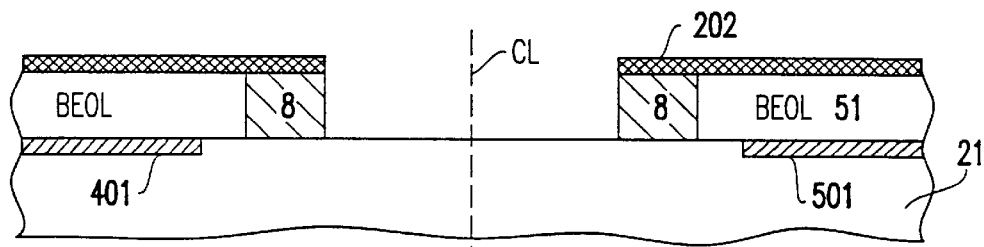
Figure 2C:
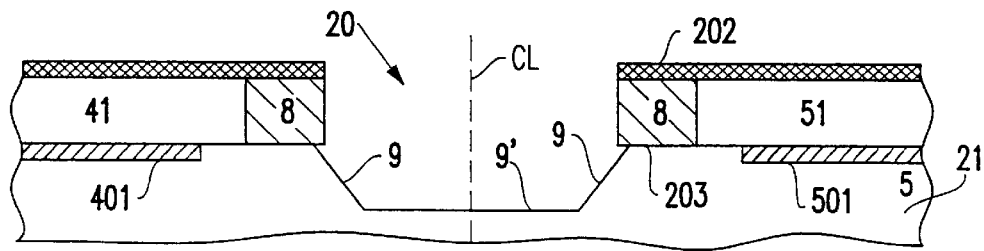

Continuing in the description of the inventive process, and as shown in FIG. 2B, the kerf area 8 common between chips 4,5 of the front surface 203 of the silicon substrate 21, is appropriately patterned to form mask pattern 202, e.g., a photolithographically patterned $Si_3N_4$ film. As shown in FIG. 2C, then the exposed area of the substrate 21 is wet etched to create the recess 20. The nature of this etch operation is set forth in greater detail hereinafter.

The chip 5 is formed in a single crystal semiconductor wafer substrate 21 in which the mask 202 is aligned with the [110] direction of the upper surface 203 of the silicon substrate 21. A crystallographic anisotropic wet etch of the substrate 21, where exposed through mask 202 is used to form recesses 20 comprised of beveled side edges 9 terminating on a flat bottom 9' in the bulk of substrate wafer 21 in the kerf area 8 dividing the active areas 401 and 501 of neighboring chips 4, 5. The side edges 9 of recess 20 form an angle $\alpha$ with substrate surface 203. While silicon nitride is preferred for mask layer 202, the present invention is not limited thereto, as other conventional mask materials used for anisotropic wet etching of silicon wafers also could be used.

The wet anisotropic etchants that can be used for etching cavities 20 in the silicon substrate 21 located below the kerf area 8 between adjacent chips 4 and 5 include the same etchants used for etching the mesa structures 2 on the mandrel 1. These etchants, due to their anisotropic nature, have differential etch rates for different crystallographic planes, thereby creating a tapered or beveled side edge in the recess or cavity created. Therefore, anisotropic etchant results in (111) oriented sidewalls 9 on the cavities 20 formed in the kerf areas 8 between chips 4 and 5. For example, using KOH etchant on a (100) silicon wafer, the etch angle $\alpha$ will be 54.7° relative to the (100) plane.

The geometric dimensions of the unexposed (masked) silicon surface-areas 203 have the important function of controlling the lateral dimensions of the beveled recess edges 9 of the cavities 20. Since the silicon etch is anisotropic, (111) crystal surface forms the planar recess bottom 9'.

Figure 2D:
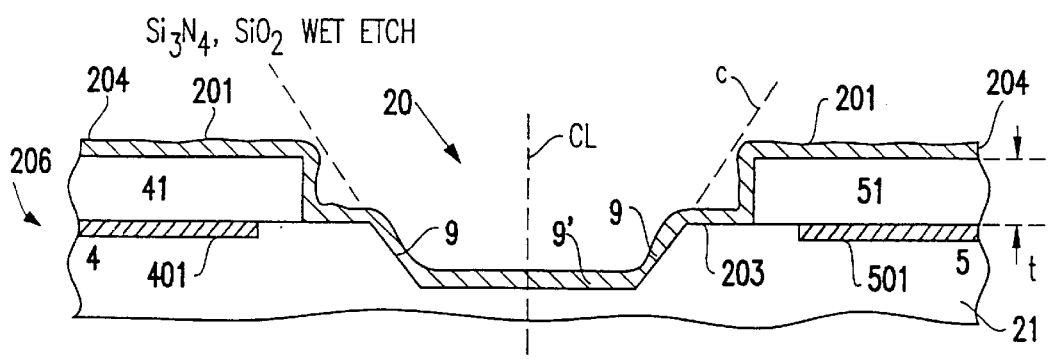

In FIG. 2D, the mask 202 and remaining kerf area 8 has been removed so that the extension of the angled surface 9 offers clearance access, as indicated by hatched lines "C" extending beyond the thickness "t" of each of the BEOL regions 41 and 51, for a mesa 2 of a mandrel 1. The thickness of the PECVD layer 204 is formed sufficiently thin relative to the thickness of the BEOL areas 41, 51 such that its thickness can be practically disregarded insofar as the clearance C.

At this stage of processing any optional protective layer that has been previously applied to the BEOL 41, 51, as described above, is removed.

As also shown in FIG. 2D, an important operation performed at this stage of processing is that the outer surface of the workpiece 206 is coated with a thin layer 204 of PECVD (plasma-enhanced chemical vapor deposited) $SiO_2$.

Figure 3A:
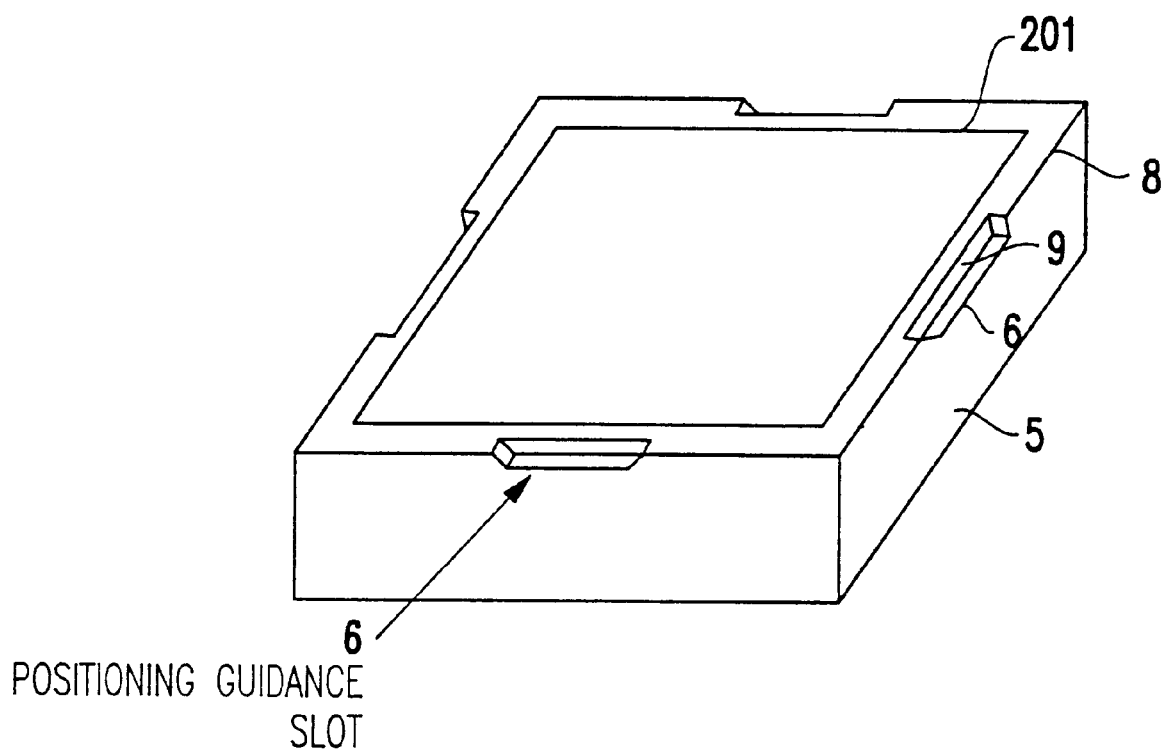
FIG. 3A is an elevational view showing an array of positioning guidance cavities formed in the front side kerf area of an integrated circuit chip.

At this point, the substrate 21 is diced through at the centerline CL of recess 20 to separate chip 5 from chip 4, as shown in FIG. 3A. The diced chips 4, 5 retain a major portion of each half of the geometry of original cavity 20. The dicing will remove some minor portion of the cavity 20 by virtue of the thickness of the dicing wheel blade (unless cleaving is instead used). However, the (111) oriented sidewall 9 adjacent to the device active area 22 remains with the chip 5 (and similarly to chip 4).

The sum of the cavities 6 left in each of chip 5 and chip 4 (separated from chip 5) are slightly less than one half the original width of original recess 20 indicated in prior FIG. 2D. However, if conventional cleaving is instead used to separate chips 4 and 5, the cavities 6 shown in FIG. 3A on chip 5, which were concurrently formed on several different sides of chip 5 in the manner described above, are essentially the same size as the original width of original recess 20.

The positions and number of cavities 6 in the kerf areas 8 can vary, as do the length of them. However, the ultimate geometry, size and number of cavities 6 in each kerf area 8 formed on and as part of the integrated circuit chip 5 must be related to the geometry, size and number of corresponding mesa structures 2 formed on the mandrel 1, as explained in detail hereinafter.

Figure 3B:
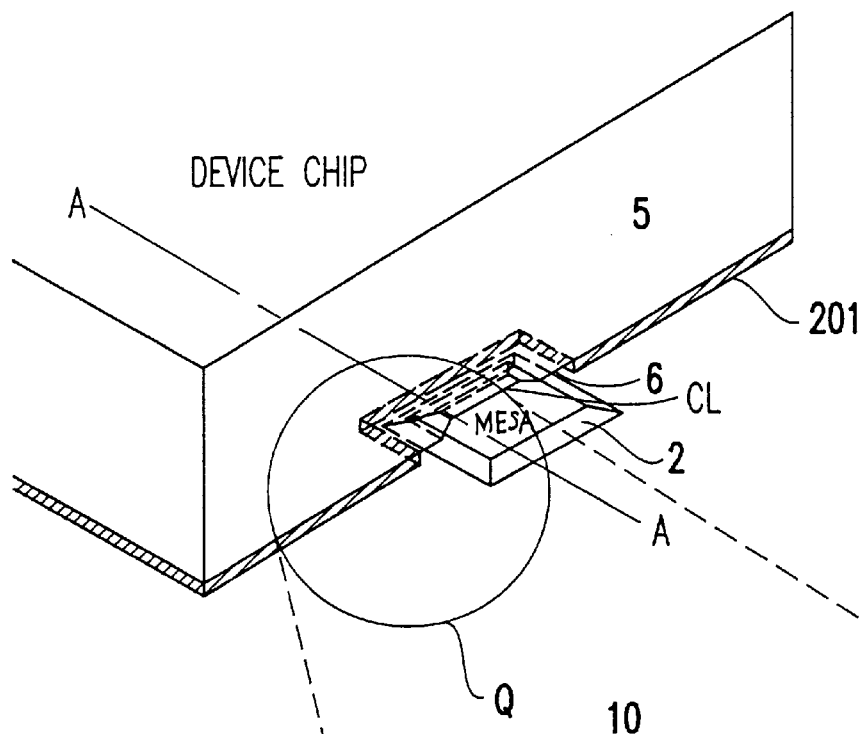
FIG. 3B is an elevational view of a diced chip positioned on the mandrel by mechanical interlock of a cavity in the chip with a mesa on the mandrel.

The key consideration is the manner in which the alignment cavities 6 in FIG. 3A have been formed in the kerf area of each IC chip 4, 5 to be integrated together. In this regard, the objective is to form an etched recess 20 (e.g., see FIG. 2D) in the kerf area of a substrate wafer, which upon dicing down its centerline CL, provides a chip 5 having a frontside 201 with cavities 6 in the kerf area 8 bounding the chip's active area 501 and where each cavity 6 fits over a portion of a mesa projection 2 of the mandrel 1 (see FIG. 3B).

Figure 3C:
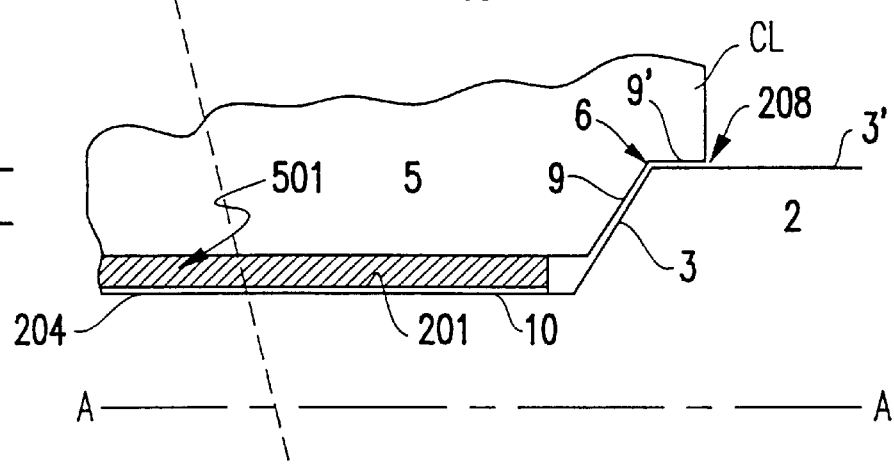
FIG. 3C is an enlarged view taken perpendicular to direction A—A of area Q indicated in FIG. 3B.
Figure 3D:
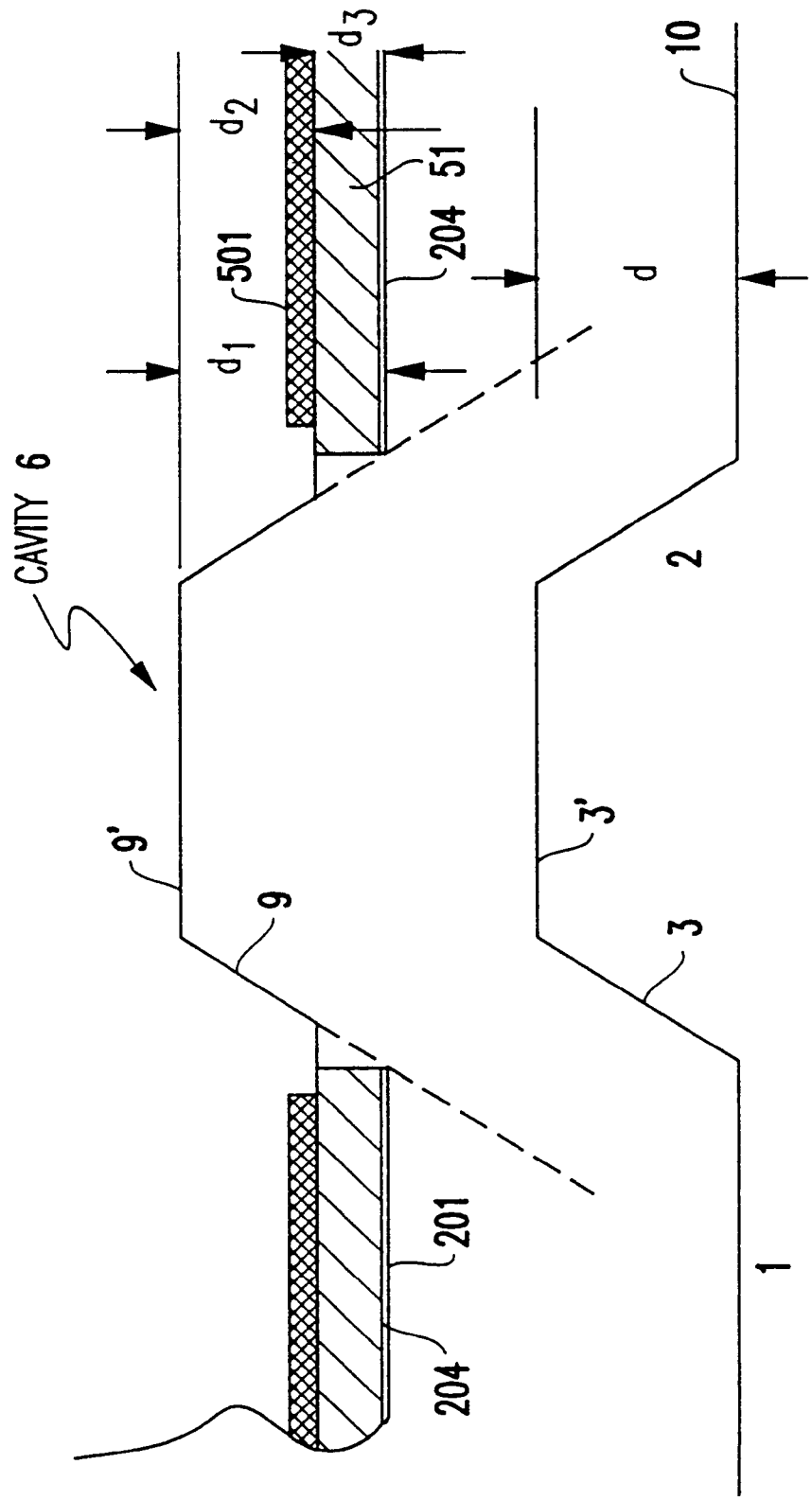
FIG. 3D is an enlarged cross-sectional view of a mesa-to-cavity interlock according to one embodiment of this invention taken along the centerline CL shown in FIG. 3B.
Figure 3E:
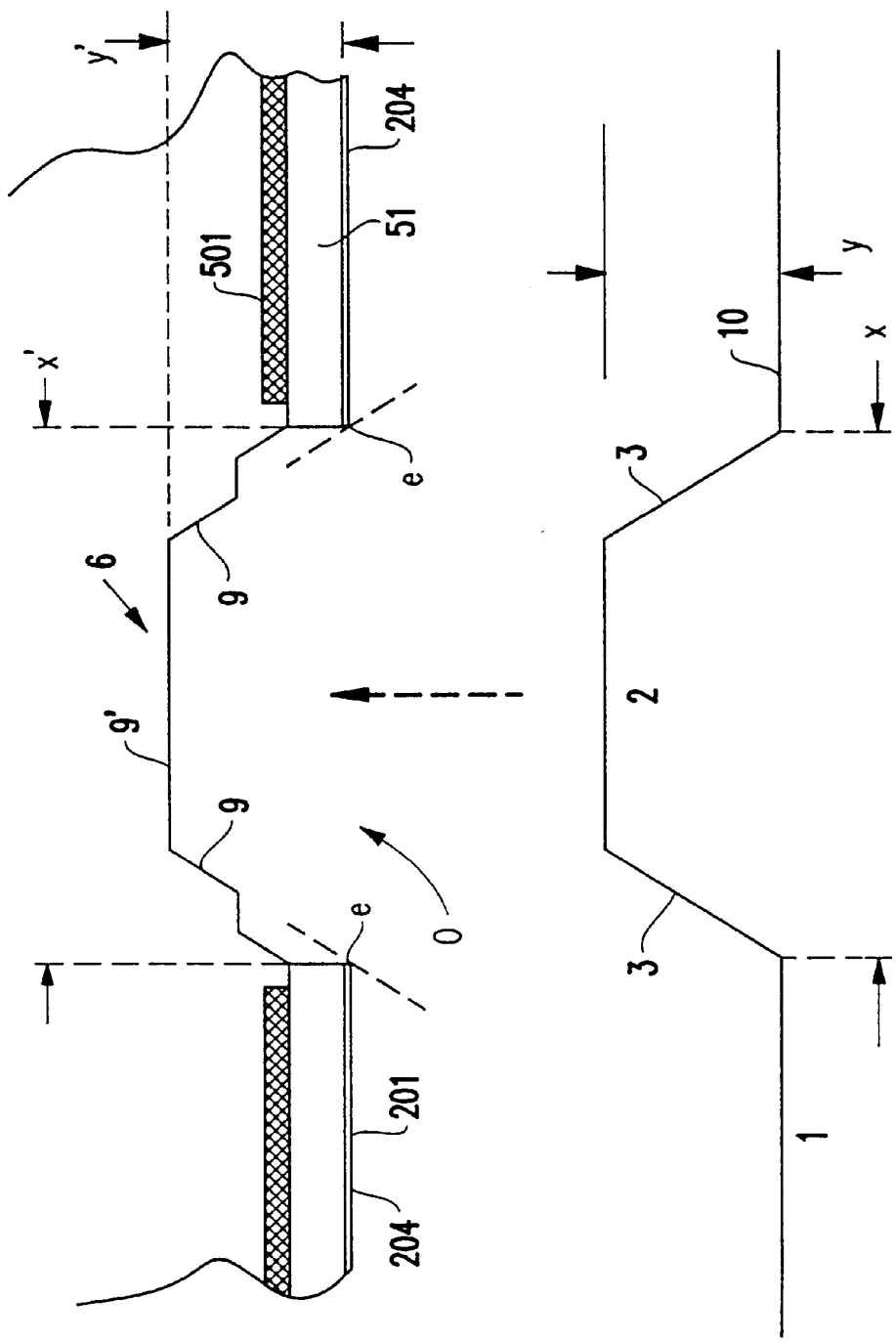
FIG. 3E is an enlarged view of a mesa-to-cavity interlock according to another embodiment of this invention taken along the centerline CL shown in FIG. 3B.

The geometries involved with mating integrated circuit chip 5, for example, to a mesa 2 on the surface of a temporary mandrel 1 are shown with greater detail in the enlarged views of FIGS. 3C–E. Although only the chip 5 is shown as positioned on the mandrel 1 in FIGS. 3C–E for illustrative purposes, it will be understood that the present invention encompasses positioning a single chip or a plurality of chips presented on mesas 2 formed on the mandrel 1.

For this illustration, the chip cavity 6 is a four-sided well configuration with a flat bottom 9', illustrated in cross-section in FIGS. 3C–E, while the mandrel mesa projection 2 is a 4-sided structure with a flat plateau 3' that is inserted into cavity 6 of chip 5.

In this manner, each of chips 4 and 5 will have appropriate cavities 6 formed in the silicon substrate 21 thereof with beveled edges 9 and a bottom depth of each cavity 6 permitting placement of the side edges 3 and height dimension of the mesa structures 2 formed on the mandrel 1 within cavity 6 at least until the outer major planar flat 201 of the chips meets the outer major planar flat 10 of mandrel as shown in FIG. 3C. As also indicated in FIG. 3C, a gap 208 remains between the mesa plateau 3' and the bottom 9' of cavity 6 of chip 5 when the major flats (201, 10) are brought into physical coplanar contact.

Referring to FIGS. 3C–E, it is imperative that the cavity 6 and mesa 2 be sized to permit the major flats, i.e., front surface 201 of the chip 5, and the outer surface 10 of the mandrel 1, to directly contact each other in co-planar fashion before, or at the latest, simultaneous to when, the mesa plateau 3' contacts the cavity flat 9' at its bottom. The cavity sidewalls 9 and the opposing side edges 3 of the mesa 2 are sloped at the same angle to permit conformal contact sliding between the two.

In the embodiment shown in greater detail in FIG. 3D where the metallization 51 is stepped back from the mesa 2 (such as in the intermediate assembly formed as shown in FIG. 2D), the height d of the mesa 2 from flat 210 is a smaller value than the combined depth $d_1$ comprised of the cavity depth $d_2$ in the substrate 21 plus the thickness $d_3$ of the overlying metallization 51. The hatched lines in FIG. 3D indicate the ability for inserting the mesa 2 into cavity 6 in which the cavity sidewalls 9 conformally confront the side edges 3 of the mesa 2.

In an alternate embodiment of the invention shown in FIG. 3E, the edges "e" of metallization 51 and active area 501 of chip 5, where bordering cavity 6, is arranged to be flush with the side edges 3 of mesa 2 when fully positioned within cavity 6. To accomplish this, the width x of the mesa 2 is sized to be larger than the width x' of the opening "o" formed in the active area 501 and metallization 51 to define the entrance to cavity 6, i.e., the lateral distance between active areas 501 and overlying metallization 51. This sizing arrangement locks the mesa 2 inside cavity 6 with the sloped cavity edge 9 being in contact with the sloped side 3 of the mesa 2. Thus, by providing mesa side edges 3 and cavity sidewalls 9 at the same angle, and by providing a mesa height y that is smaller than the combined depth y' of the cavity 6 plus the thickness of the metallization 51, the mesa 2 can also interlock with the outer profile presented by chip 5 at the edges "e" of the BEOL metallization 51 and active area 501 bordering cavity 6.

A combination of different sized chips and/or chips having different shapes defined by their peripheral edges (e.g., mixtures of squares and rectangles, and so forth)-can be positioned on the common mandrel 1 in the above manners, as long as the chip depressions and mandrel mesa projections are dimensioned in compliance with the constrains described herein.

Where chips 4 and 5 are intended to ultimately remain side-by-side in close proximity to each other in a finished electronic package, the spacing of gap 32 can be reduced to a gap dimension convenient for gap filling and dicing. If the gap 32 is made too small, it can be difficult to wick filler into the gap. This gap 32 can be filled by a material having a flowable state to facilitate complete filling of the gap 32. The gap filling material should be selected as a material able to tolerate the heat associated with additional subsequent metallization operations, e.g., polyimide, epoxy, or SOG.

Figure 4A:
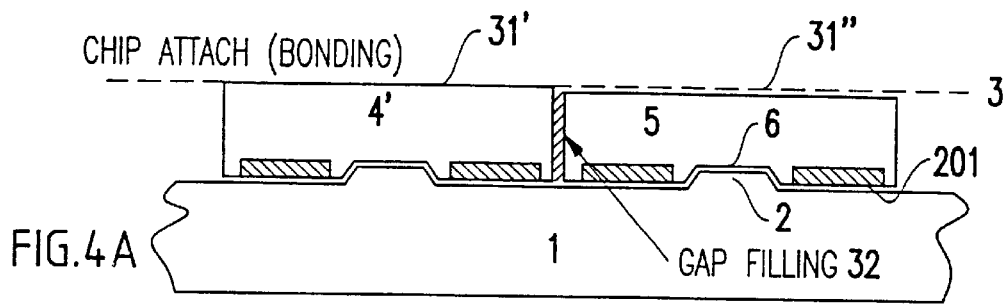
FIGS. 4A–4E depict the overall scheme of process steps according to the invention for making an assembly of planarized circuit chips processed to have uniform thickness.

As indicated by the hatched lines in FIG. 1B, and with the resulting assembly shown in FIG. 4A, the diced integrated circuit chips 4, 5 are each placed face down, i.e., with active areas 401,501 facing mandrel 1, onto and against the corresponding located mesa structure 2 on the mandrel 1 to which it is mated with a standard pick and place tool. Contact is made between the major surface 10 of the mandrel 1 and the exposed oxidized layer 204 previously formed on BEOL area 51 and cavities 6 of the chip 5. Van der Waals forces cause the two surfaces to attractively associate. A brief anneal can be applied for several minutes at a low temperature (350–450°) by either a hot stage or lampheating to cause the diced component chips 4, 5 to enhance the adherence between the mandrel 1 and diced chips 4,5. The elevated temperature bonding is done after the mandrel wafer 1 is fully populated with the desired collection of integrated circuit chips 4,5. Alternatively, the integrated circuit chips 4,5 can be adhesively bonded to the mandrel 1 with the use of an appropriate adhesive, such as a temperature stable epoxy that can tolerate temperatures greater than 400° C. Critical to the success of the bonding is surface cleanliness. Therefore, just prior to the association step, the mandrel 1 and the integrated circuit chips 4, 5 preferably are subjected to a conventional cleaning procedure.

Upon mating the chip cavities 6 with the mesa structures 2 on the mandrel 1 in this manner, the position of the chip 5 is fixed for purposes of further processing involving planarizing the backside of the integrated circuit chips, as described hereinafter.

In any event, referring now to the process scheme shown in FIGS. 4A–D, after mating chip 5 and chip 4 to mandrel 1 and providing a gap filler 32 (e.g., polyimide), the next step of the process is performing backside planarization of the chips 4,5. Chip 4 has been processed in a similar manner as chips 4 and 5 as described above insofar as the positioning cavity formation, except that chip 4' is derived from a chip workpiece other than workpiece 206 (e.g., see FIG. 2A). Separate chips derived from the same or different chip workpieces generally will not have identical thicknesses.

Figure 4B:
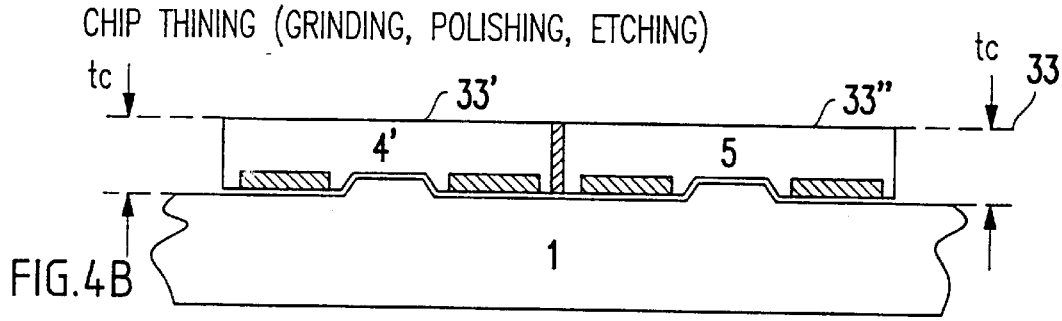

For example, the thickness of the semiconductor substrate wafer may vary between chips derived from separate workpieces and/or different active area and metallization processing will cause variations in thickness between separate chips. Therefore, the back surface profile 31 is not co-planar with -all the chip backsides 31' and 31". Accordingly, at this stage of processing, the back surfaces 31' and 31" are simultaneously planarized using high speed silicon polishing, e.g., conventional CMP, used in wafer polishing, resulting in the planarized backside 33 extending co-planar with both chip backsides 33' and 33", as shown in FIG. 4B. After completing planarization, the overall remaining thickness of all the planarized chips 4', 5 of uniform thickness can be as little as 200 µm, or even smaller.

Figure 4C:
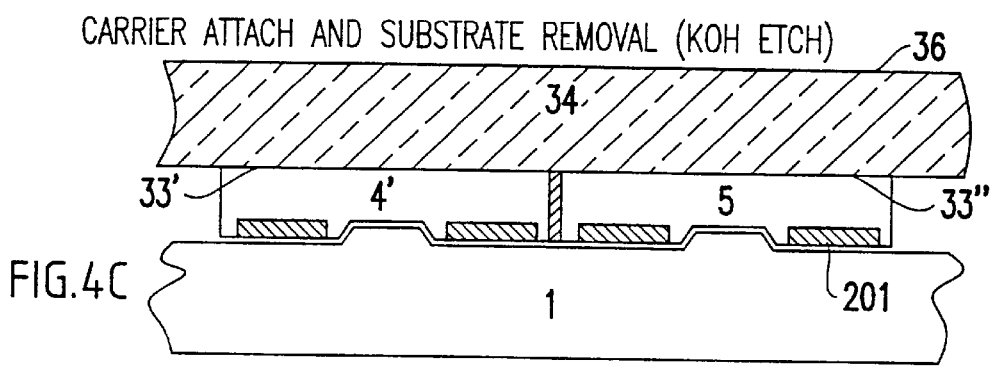

Then, a permanent substrate carrier 34 is provided for chip bonding, as shown in FIG. 4C. The permanent substrate carrier is pretreated prior to contact with the chips and mandrel assembly whereby a thin film (not shown) of PECVD silicon dioxide is formed on both its backside 36 and what will be its chip receiving face 33'. The backside oxide will be used as an etch stop while the frontside oxide formed on carrier 34 in this manner will facilitate joinder to the chips 4, 5. The polished backside 33 of the bonded chips 4,5 is then placed in contact with the planar, oxidized surface 33" of carrier wafer 34. The bonding process is then repeated so that the bonded chips 4,5 at this time are sandwiched in-between the original mandrel 1 with its mesas 2, and the planar carrier wafer 34, with the resulting assembly shown in FIG. 4C.

Figure 4D:
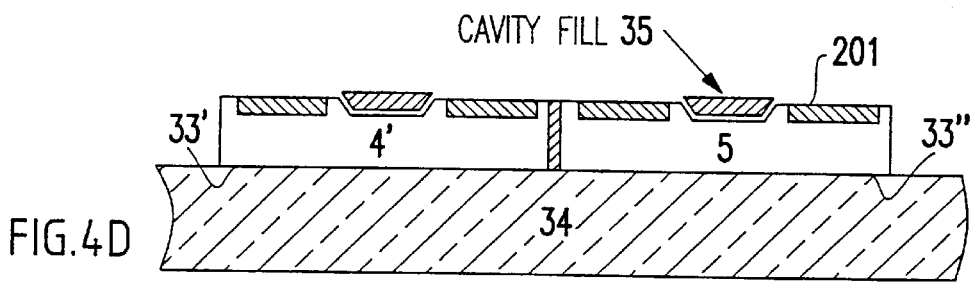

The low doped mandrel 1 is then selectively removed by immersing the mandrel 1 in KOH, EPGW, or another anisotropic etchant for silicon, to remove the temporary support 1 from the chips 4,5, to leave chips 4,5 exposed on the front outermost planar surface 201 having the metallization 41, 51 and active device areas 401, 501, respectively, while retaining the attachment of the back sides 33', 33", respectively, of the chips 4,5 to carrier wafer 34, and resulting in the structure shown in FIG. 4D. To reduce the processing time needed to remove the mandrel 1, it is also possible to perform a preliminary operation on the mandrel 1 in which it is mechanically lapped to remove a significant thickness of the mandrel 1 from its exposed side, and then lapping is discontinued when only a relatively small thickness of the mandrel 1 remains for etch removal. PECVD silicon oxide layer 204 that was previously formed on the surfaces of the chips 4 and 5 provides a natural etch stop to protect chips 4 and 5 from the etching operation used to remove the mandrel 1. Likewise, the PECVD silicon oxide layer formed on the back face 36 of the permanent substrate 34 protects it from the etchant used to remove mandrel 1. The mandrel 1 was low doped to be selectively etched at a higher rate from a productivity standpoint since a highly doped mandrel, which could be used, will etch relatively more slowly.

The removal of the mandrel 1 in this manner will leave behind, in those areas where the mesas 2 were positioned into the cavities 6, an open set of cavities. These must be filled and planarized with an appropriate insulating material 35, such as polyimide, as shown in FIG. 4D.

Figure 4E:
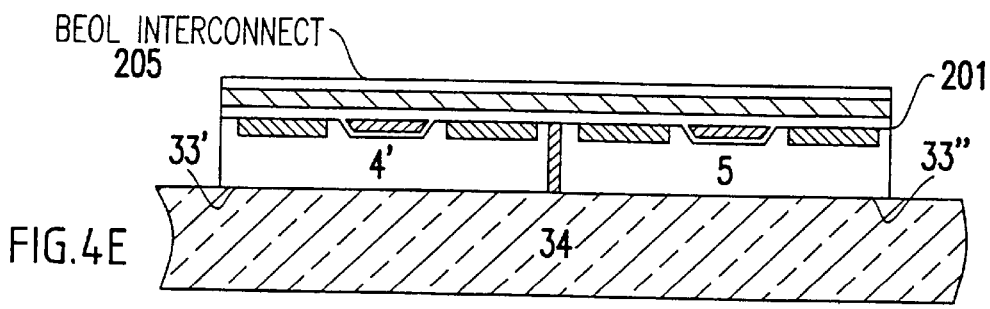

To provide inter-DCC wiring, the exposed front surface 21 of the collection of chips 4,5 is subjected to conventional BEOL interconnect metallurgy processing to provide BEOL interconnect 205. This can be accomplished due to the accuracy of the earlier step of chip positioning onto the temporary mandrel 1. Vias are cut through the outer oxide layer on the front surface of the chips 4,5, filled with metal and polished down as in standard via-stud processing. If the line width and pitch permit, both lift off and sub-etch process may also be used. In order to accommodate the tolerances of DCC placement, a set of buffer pads between the DCCs may be employed as intermediate landing sites for the inter DCC wiring. Multilevel metallization is formed by conventional methods to complete the wafer level wired system shown in FIG. 4E.

In this manner, several DCCs with different functionality can be wired with line widths, pitches and distances that are characteristic of a backend process rather than a MCM process.

Figure 5:
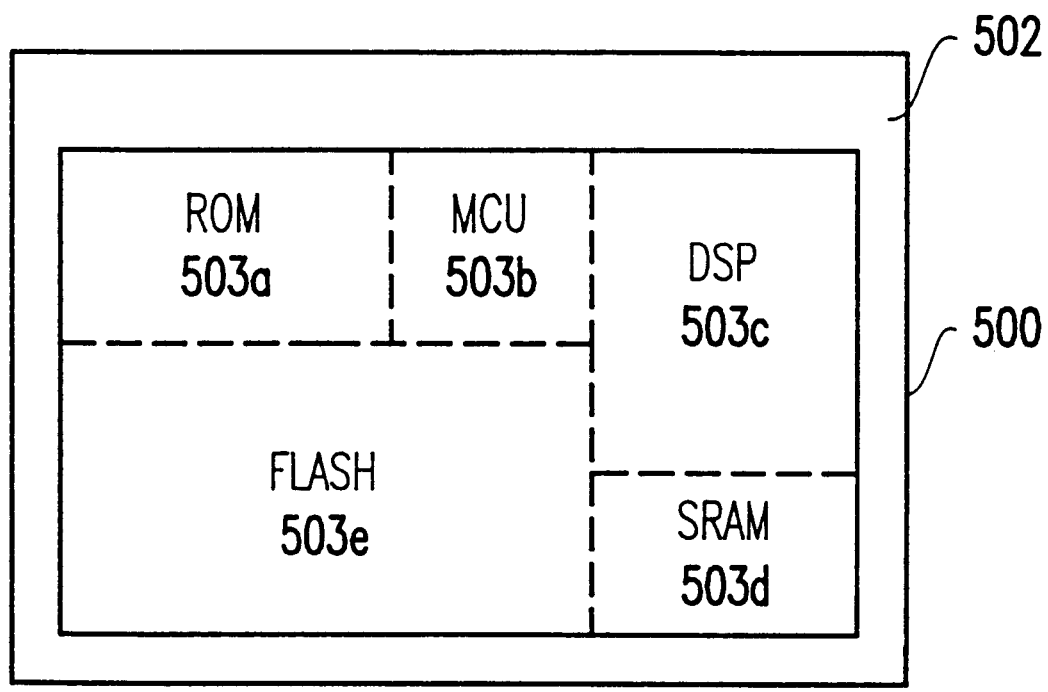
FIG. 5 depicts a top view of hybrid chip module assembled according to the invention.

FIG. 5 depicts a top view of an example of hybrid chip package that can be assembled according to the invention. Using the chip depression/mandrel projection system of this invention during simultaneous backside planarization of a plurality of different thickness chips, a variety of different types of integrated circuit chips and sizes can be assembled together on a common substrate. As illustrated in FIG. 5, the final integrated module 500 has variegated chips 503a–e comprised of ROM, MCU, DSP, SRAM and FLASH chips positioned on a common carrier substrate 502. It should be noted that the integrated circuit chips 503a–e, which are assembled together in the module 500, are not limited to the examples provided here, and they may be formed from substrates of similar or dissimilar materials, and the processing methods to form the active devices in the integrated circuit chips may have been radically different from each other as long as the chip positioning means of the present invention is employed.

The mandrel projections 2 are illustrated in FIG. 1B as four-sided mesa-like structures having four sloping sidewalls. It can be understood that if an etch mask stripe is provided to extend partly from one edge of the mandrel wafer 10 towards an opposite edge thereof that a ridge-like projection would be created by the etching procedure instead of a mesa. This embodiment would prevent movement of a chip positioned on the ridge in lateral direction to the ridge, although the chips could slide along the ridge. Therefore, in this optional scenario, the ridge should be made discontinuous with a terminus provided at both ends before the ridge reaches either edge of the mandrel wafer to afford some ultimate sliding movement control for chips positioned thereon. Such a ridge-like projection on the mandrel could be used where a trench-like depression (i.e., two spaced beveled edges extending along a common flat trench bottom) is formed on the bottom surface of a chip from one edge thereof to the other for chip positioning purposes.

Also, while the semiconductor wafer material used for chips 4 and 5, and the mandrel 1, have been exemplified as silicon, these materials also may be other semiconductor materials such as germanium, gallium arsenide, a compound of a Group II element and a group VI element, a compound of a Group III element and a group V element, or any other semiconductor material susceptible to crystallographic anisotropic etching. The wafer thicknesses used in practicing this invention can be a standard wafer thickness in the industry, such as about 700 to 800 µm for a 200 mm diameter wafer, although it is not limited thereto, as long as the mandrel and chips must have sufficient thickness to allow the alignment mesas and cavities, respectively, to be formed in the wafer thicknesses provided.

In the implementation of this invention, conventional chip handling and placement tools, such as robotic placement chucks and vacuum probes capable of controlled x-y movement, may be used to position an integrated circuit chip fabricated according to this invention such that its surface depression is interfitted with a corresponding surface projection provided on the mandrel surface. Once the circuit chip is properly oriented, a robotically controlled vacuum probe will place the chip onto mandrel mesa projections, the orientation of which has been similarly aligned. Once in place, the chips are mechanically agitated to insert fully onto the mandrel mesa projections.

Optionally, one or more pressure relief holes (not shown) can be drilled through the mandrel, preferably prior to assembly, in order to relieve pressure created by trapped gases. Suitable drilling techniques include laser ablation, ion beam milling or cryogenic plasma etching.

The present invention enjoys various advantages over prior art schemes. The present invention permits the accommodation of chip modules that are of different thicknesses by use of the front surface leveling scheme. The front reference placement scheme of this invention allows the retention of a planar wiring surface. The result is a high level, low profile wafer level integrated system on a single low cost substrate that can use silicon based technology.

Also, since the respective depressions and projections provided in both the integrated circuit chips and the temporary mandrel are defined lithographically, and created with anisotropic etching methods, the respective dimensions are highly controllable. The method also reduces the overall areal size of the assembly due to smaller space requirements.

Still another advantage is improved overall chip yields of such chip assemblies over single large area chips having similar functionality. The improved yield derives from the generally superior yields of smaller chips coupled with pretesting of such chips prior to final assembly.

Still another advantage is the ability to assemble dissimilar integrated circuit chips (e.g. silicon, gallium arsenide, etc.), requiring different processing conditions, into a final chip assembly.

While the invention has been described in terms of a few preferred embodiments, those skilled in the art will recognize that the invention can be practiced with modification within the spirit and scope of the appended claims.

What is claimed is:

1. Process for making an integrated circuit module in which a plurality of integrated circuit chips are assembled on a common carrier substrate in precise alignment, comprising the steps of:
   providing a mandrel having a planar mandrel surface and projections distending from said planar mandrel surface, and said projections having sloping sidewalls;
   providing a plurality of integrated circuit chips each having a semiconductor substrate, a backside surface, and a substantially planar frontside surface including active devices, wherein surface depressions are formed through said frontside surface and into said semiconductor substrate, wherein each of said surface depressions have beveled side edges with substantially the same angle of inclination as that of said sloping sidewalls of one of said mandrel projections;
   placing one of said depressions of said chip onto said mesa of said mandrel until said chip frontside surface contacts said planar mandrel surface, whereby each chip is positioned on a projection;
   planarizing said backside surfaces of said chips;
   attaching said planarized backside surfaces of said chips to a permanent chip carrier; and
   removing said mandrel from said frontside surfaces of said chips.

2. The process of claim 1, wherein said mandrel projection has a height that is smaller in distance than the depth of said cavity.

3. The process of claim 1, wherein said placing step comprises positioning said beveled edges of said chip depressions and said sloping sidewalls of said mandrel projections in direct conformal, juxtaposed contact.

4. The process of claim 1, wherein said placing step comprises positioning said beveled edges of said chip depressions and said sloping sidewalls of said mandrel projections in a spaced orientation relative to each other, and wherein a mechanical interlock occurs where said mesa physically abuts the active area of said chip where bordering said depression.

5. The process of claim 1, wherein said mandrel and said chips are silicon wafers, and said mandrel projections and said chip depressions are formed by crystallographic anisotropic etching.

6. The process of claim 5, wherein said crystallographic anisotropic etching is performed using a wet etchant.

7. The process of claim 6, wherein said wet etchant is selected from KOH, ethylenediamine/pyrocatechol/water or ethylenediamine/pyrocatechol/quinoxaline/water.

8. The process of claim 1, wherein said mandrel is lightly doped with impurities, and said mandrel is selectively removed by etching.

9. The process of claim 1, wherein said mandrel further includes:
   an upper face comprised of a planar base surface portion bordering said projection wherein said projection has a flat top surface, wherein said sloping sidewall of said projection extends from said planar base surface portion to said flat top surface of said projection, and
   wherein said circuit chips further include:
      a front side surface comprised a planar inner chip surface portion bounded by a kerf region including said surface depressions and said surface depressions each has a planar recess bottom surface, wherein said beveled edges of said surface depressions each extend from said planar outer chip surface portion to said planar recess bottom surface.

10. The process of claim 9, wherein said planar chip surface portion rests in direct contact on said planar base surface portion, and a vacant space exists between said recess bottom surface and said flat top surface of said projection.

11. The process of claim 1, wherein said surface depression in said chip is formed with at least two beveled edges and said mandrel projection is formed with at least two sloping sidewalls, wherein said at least two beveled edges of said surface depression in said chip are in juxtaposition with said at least two sloping sidewalls of said mandrel projection.

12. The process of claim 1, wherein said surface depression in said chip is formed having four beveled edges and said mandrel projection is formed having four sloping sidewalls, wherein said four beveled edges of said surface depression in said chip being in juxtaposition with said four sloping sidewalls of said mandrel projection.

13. The process of claim 1, wherein the material of at least a bulk portion of said mandrel and the material of at least a bulk portion of said chips are selected as having the same crystallographic structure.

14. The process of claim 13, wherein said material is a semiconductor material.

15. The process of claim 14, wherein said material is silicon.

16. The process of claim 15, wherein said silicon is a (100) wafer, and said planar outer chip surface portion is aligned with the [110] direction and said beveled edge is a (111) oriented crystal face, and said flat top surface of said projection is aligned with the [110] direction and said sloping sidewall is a (111) oriented crystal face.

17. The process of claim 16, wherein said sloping sidewall of said projection forms an angle of approximately 125.3° with said flat top surface of said projection, and said beveled edge forms an angle of approximately 125.3° with said planar outer chip surface portion.

18. The integrated circuit module product as made by the process of claim 1.

* * * * *